United States Patent Office 3,148,064

Patented Sept. 8, 1964

3,148,064

LIGHT SENSITIVE PHOTOGRAPHIC COMPOSITION CONTAINING ALUMINUM STEARATE AS A TRANSLUCENT PIGMENT

Frederick J. Rauner and Joseph J. Murray, Rochester, N.Y., assignors to Eastman Kodak Company, Rochester, N.Y., a corporation of New Jersey No Drawing. Filed May 19, 1960, Ser. No. 30,100
8 Claims. (Cl. 96—91)

This invention relates to photosensitive polymeric compositions for various photomechanical and photoresist purposes and more particularly to the use of radiation-transmitting pigment particles for improving the speed, chemical and physical properties and adhesion to the support of coatings of such compositions.

One of the difficuties frequently encountered in the preparation of stencils and the like for various photomechanical purposes where a resist is employed to protect the surface of the support from attack by etching solutions in those areas where removal of the support is not required or is undesirable is the failure of the resist to fully protect the support in such areas. The failure of the resist to protect the support in specific areas has ranged from formation of pinholes in such areas to the extent that the resist image floats away from the support when the exposed and developed element is immersed in the etching bath. Of concern also in the preparation of photo-resist images employing polymeric compositions which are rendered hardened or less soluble on exposure to light or ultraviolet radiation is the reduced speed inherent in such compositions particularly where thicker coatings are required for deep etching. Another problem inherent in the preparation of photo-resist coatings is the tendency of such coatings to swell and otherwise become distorted when developed, after exposure, by removing the unexposed portions by treatment with a solvent.

It has now been found that these problems can be overcome by incorporating in the polymeric photosensitive compositions of which this invention pertains, certain finely divided, solid, radiation-transmitting pigment particles. Although the exact mechanism of the invention is not known, nevertheless it is possible to impart to photosensitive polymeric compositions an improvement in photographic speed and certain chemical and physical properties to finally produce hardened resist images having improved resistance to swelling in the presence of developer solvents and having substantial improvement in adhesion of the resist to the support.

Accordingly it is an object of the present invention to provide improved photosensitive polymeric coating compositions. Another object is to provide polymeric coating compositions having improved photographic speed. A further object is to provide photo-resist coatings having increased adherence to the support. Still another object is to provide photo-resist images which are relatively non-swelling in the presence of solvent developer solutions. A still further object is to provide photoresist images having improved physical properties. Other objects will become apparent from the following description of our invention.

These objects are accomplished by incorporating into photosensitive, polymeric compositions finely divided, solid, translucent radiation-transmitting pigment particles.

The materials suitable for use in our invention must have low radiation absorption and low energy scatter in the wave length region to which the composition is sensitive. Materials to have low energy scatter in the polymeric photo-sensitive composition according to the invention must be materials which have a refractive index substantially the same as the refractive index of the polymeric coating. Such a refractive index should be measured in a wavelength region to which the particular system is sensitive. It is apparent that the index of refraction of various polymeric compositions will vary, accordingly translucent materials suitably employed in such compositions according to our invention must have a refractive index which differs from the refractive index of the polymeric coating by no more than 0.02 and preferably by no more than from about 0.005 to about 0.015 refractice index units. The translucent pigment materials of our invention must also be of sufficiently small particle size as to give good resolution. Suitable particle size usually comprises an average diameter of from about 8 to about 60 microns while especially useful particles have an average diameter in the range from about 6 to about 15 microns. Generally, suitable particle size comprises 300 mesh or smaller. Suitable particles must also be wet by but must be insoluble in the photosensitive coating and the solvent used for preparing the composition and developing the exposed coatings. The translucent pigment materials which we have found to be especially useful in the practice of our invention include aluminum stearate, ground glass, glass beads, talc, calcium stearate, clear ceramic oxide, polymethylmethacrylate, granular or short fiber plastics, e.g., cellulose acetate, mica and synthetic mica. Synthetic mica is sold under the trade name "Synthamica" and comprises fluor-phlogopite mica.

The photosensitive layers made according to our invention can be prepared by incorporating a translucent pigment material as herein disclosed in a light-sensitive polymeric composition and coating on a suitable support. In general, the selection of a light-sensitive polymeric composition, the solvent for its application, the method of coating on the support to which it is applied depends upon the intended use of the resist image produced. The choice of the film-forming polymeric photosensitive composition will depend also upon the photographic speed required, the surface to be coated, and the properties desired in the final stencil-like resist image. The advantages which accrue to our invention are broadly applicable to the various uses of photosensitive resist compositions as prepared on a suitable support. The invention is particularly advantageous for use with photosensitive polymeric coatings on glass, ceramic supports and metal such as aluminum and zinc. The translucent pigments of our invention are particularly advantageously employed in compositions where the resulting polymeric images are to be used as resists for highly active etching or plating compositions.

The translucent pigments of our invention are useful in the photosensitive compositions in an amount by weight from about 0.3 to about 3.0 times the weight of the composition with especially useful concentrations being in the range from about 0.7 to about 2 times the weight of the composition. It has been determined that a concentration of translucent pigment in the photosensitive composition to an amount about two times the weight of the polymer compound results in an effective speed increase of from about 4 to about 10 times the speed of compositions not containing the translucent pigment. In general, for each of the translucent pigments the higher the concentration of radiation-transmitting pigment the greater the effective increase in speed. The upper limit of additive concentration appears to be about 3 times the weight of the photosensitive polymer. The pigments can be incorporated in the polymeric film-forming composition by mixing where additives such as ground glass are employed, and in other cases where calcium stearate, for example, is used, it may be required to ball mill the additive-polymeric mixture to assure uniform distribution throughout the composition. After thorough mixing of the pigment-polymeric material, a coating can be made onto a support by such means as whirling onto the surface, or by flow-coating which means to allow an amount of composition to flow evenly over the surface and then to place the support in a vertical position to dry. Coatings prepared in this manner are exposed, after drying, in the usual manner to actinic radiation, that is, visible radiation and/or ultraviolet radiation, from behind a line or halftone negative. After exposure the coatings are treated with a solvent to remove the coating only in the unexposed areas of the coating and an intermediary plate is thus obtained provided with a resinous resist image useful as an etching resist or as a final printing plate.

A wide variety of photosensitive polymeric film-forming compositions useful for making relief or stencil-like resist images can be employed in our invention. The film-forming binder polymer or resin can be a natural rubber or modified natural polymer such as rubber, shellac, gelatin, or glue, or a synthetic polymer like polyvinyl alcohol, polyethylene, nylon, or styrene-butadiene copolymer, or a compatible mixture of such polymers. In such materials the photosensitivity or property of becoming insolubilized on exposure to visible or ultraviolet radiation is imparted, or brought up to a practical value by addition of photosensitizing components. These can be separate chemical compounds mixed with the film-forming polymer, as for example, potassium dichromate as used to photosensitize glue, gelatin, and shellac compositions, or as the arylazides of Hepher, U.S. Patent 2,848,328, issued August 19, 1958, and 2,852,379, issued September 16, 1958, are used to photosensitize respectively, water-dispersible and organic-solvent-soluble polymers.

The photosensitizing components suitably employed can be chemical groupings which form an integral part of the film-forming polymer molecule. Examples of such intrinsically light-sensitive polymers include the vinyl cinnamate polymers and copolymers of Minsk et al., U.S. Patent 2,610,120, issued September 9, 1952, and Minsk and Unruh, U.S. Patent 2,801,233 issued July 30, 1957; the cinnamoylated styrene polymers of Unruh and Church, U.S. Patent 2,751,373, issued June 19, 1956, Unruh, U.S. Patent 2,708,665, issued May 17, 1955, Unruh and Smith, U.S. Patent 2,835,656, issued May 20, 1958; and the azide polymers of Merrill, Robertson and Staehle, U.S. application Serial No. 525,271, filed July 29, 1955, and Merrill and Unruh, U.S. application Serial No. 525,368, filed July 29, 1955. In many cases a degree of photosensitivity imparted by the photosensitizer admixed to the polymer or by photosensitizing groups in the polymer molecule is increased by addition of sensitizers which may also extend the spectral range of sensitivity. Typical sensitizers for vinylcinnamate polymers are described in Minsk, Van Deusen and Robertson, U.S. Patent 2,670,285, issued February 23, 1954, Minsk, Van Deusen and Robertson, U.S. Patent 2,670,286, issued February 23, 1954, Minsk, Van Deusen and Robertson, U.S. Patent 2,670,287, issued February 23, 1954, Minsk, Van Deusen and Robertson, U.S. Patent 2,690,966 issued October 5, 1954, and Robertson and West, U.S. Patent 2,732,301, issued January 24, 1956. Typical sensitizers, e.g., monomeric azides, are described for polymer compositions in Hepher, U.S.

Patent 2,848,328, issued August 19, 1958, and in Sagura and Van Allan, U.S. application Serial No. 756,276, filed August 21, 1958. Typical sensitizers for azide polymers are described in Robertson et al. U.S. Patent 2,870,011, issued January 20, 1959.

Particularly advantageously employed in our invention are the tough, hydrophobic, etch-resistant polymers, such as natural (sulphur-vulcanizable) rubber, cyclized natural rubber as described in Carson, U.S. Patent 2,371,736, issued March 20, 1945, oxidized rubber as described in Stevens and Popham, U.S. Patent 2,132,809, issued October 11, 1938, and synthetic hydrophobic polymers, including synthetic rubbers (especially copolymers of 1:3 diolefins) and rubberoid plastics.

These polymers can be employed in the light-sensitive compositions of our invention either as aqueous dispersions or as solutions in organic solvents. Sensitivity to ultraviolet and visible light is imparted by the addition of photosensitizers such as arylazides. Typical water-soluble azide sensitizers for light-sensitive resist compositions adapted to sensitize aqueous dispersions of hydrophobic polymers, including rubber latices are disclosed in Hepher, U.S. Patent 2,848,328, issued August 19, 1958.

Representative organic-solvent soluble azides useful for sensitizing solutions of the polymers herein indicated are disclosed in Sagura and Van Allan, U.S. patent application Serial No. 756,276, filed August 21, 1958. Representative photosensitive polymers useful in our invention and having the photosensitive groups as a part of the polymer molecule include (1) the vinyl-polymers and cellulose derivatives containing integral cinnamoyl groups, $C_6H_5CH{=}CH{-}CO{-}$, as disclosed in Minsk, U.S. application Serial No. 207,052, filed January 20, 1952, and in Unruh and Allen, U.S. Patent 2,716,102, issued August 23, 1955, Unruh and Allen, U.S. Patent 2,716,097, issued August 23, 1955, Allen and Van Allan, U.S. Patent 2,566,302, issued September 4, 1951, Minsk, Van Deusen and Robertson, U.S. Patent 2,610,120, issued September 9, 1952, Robertson, Minsk and Van Deusen, U.S. Patent 2,751,296, issued June 19, 1956, and Minsk and Unruh, U.S. Patent 2,801,233, issued July 30, 1957, and (2) the linear polymers having azidoaryl side chains, as disclosed in Merrill and Unruh, U.S. patent application Serial No. 525,368, filed July 29, 1955, and in Merrill et al., U.S. patent application Serial No. 525,271, filed July 29, 1955.

The cyclized natural rubber used in some of the following examples was manufactured by Goodyear Tire and Rubber Company and was obtained under the trade name Pliolite 1230 NR. This material is soluble in a limited number of organic solvents, e.g., xylene and is resistant to acids, alkalis, alcohol, water, plating compositions, and grease.

The light-sensitive coating compositions of our invention may be prepared as follows:

*Example 1*

The following example illustrates the improvement in adhesion to the support obtained where the translucent pigment, calcium stearate, is incorporated in a composition comprising light-sensitive polyvinyl cinnamate.

A glass support was flow-coated with a composition prepared as follows:

11 grams of polyvinyl alcohol were heated overnight on a steam bath with 100 cc. of pyridine. 100 cc. of pyridine were then added and the suspension cooled to 50° C. 50 grams of a commercial grade of cinnamoyl chloride were added portion wise with agitation, during which time some heat was evolved and a precipitate formed. The reaction mixture was then heated at 50° C. under a condenser provided with a calcium chloride tube, and after four hours, during which time the suspension was occasionally agitated, a viscous dope was obtained. Dilution of the dope with acetone was followed by filtration and precipitation in water. The resultant resin was purified by extensive washing with water until free from chloride and was then dried. 3.5 grams of the polyvinyl cinnamate obtained were dissolved in 50 cc. of methyl ethyl ketone. The composition for coating onto the glass support was then made by mixing with this solution, 5 grams of calcium stearate. The mixture was then ball milled for 24 hours. The light-sensitive composition was flow-coated on glass and left to dry in a near vertical position under room temperature conditions.

A second glass support was coated to equal thickness with a composition prepared according to this example except that calcium stearate was not incorporated in the coating composition.

The resulting coatings had an average depth of about 4 mils and were white in color and opalescent.

After drying, each sample was exposed from behind a line negative for three minutes to a 35-amp. carbon arc lamp at a distance of three feet. Thereafter, each coating was developed with a high spray in a vapor degreaser using trichloroethylene. Each glass plate bearing a positive resist image was then etched in a conventional 48% hydrofluoric acid etching bath.

The results showed that the glass plate coated with the composition containing the calcium stearate was etched to a depth of 10 to 11 thousandths of an inch, and the fine detail to a depth of 3–4 thousandths of an inch. The resist image was firmly adhered to the support in all areas of the support to give a clear differentiation of etched surface and non-etched surface. The glass plate coated with the composition not containing the calcium stearate was etched only to a depth of 1 to 2 thousandths of an inch when the resist became loosened from the support resulting in a loss of the plate.

*Example 2*

The following example illustrates the increased photographic speed obtained where the translucent pigment, glass beads or ground glass, is incorporated into a composition comprising light-sensitized cyclized rubber.

A coating composition, solution A, was prepared by dissolving 30 grams of cyclized natural rubber and 0.06 gram of 4,4′-diazidostilbene in xylene. To 100 cc. of solution A, 23 grams of glass beads manufactured by the Minnesota Mining and Manufacturing Company were added. The particle sizes of the material ranged from 9 microns to about 30 microns. The formulation was flow-coated on pumiced aluminum plates and left to dry in a near vertical position at room temperature.

A control plate was coated with solution B, which was prepared according to solution A as herein described except that glass beads were omitted from the coating composition.

Image-wise exposures from behind a line negative were made of each plate by exposing to a 35 amp. carbon arc at 3 feet. Development of each plate was carried out by a spray development using a xylene-stoddard solvent composition. It was found that 45 seconds exposure to the carbon arc was sufficient to obtain a good image where the light-sensitive composition containing the glass beads was used whereas the control plate which was coated with solution B was lost on development. In the control plate, the resist became loosened from the aluminum support during the spray development. It was determined that ground-glass-resist compositions at a 2:1 ratio of glass beads to resist give an effective speed increase in such compositions of from about 4 to about 10 times the speed of compositions not containing the glass beads.

*Example 3*

The following example illustrates the advantages realized in photo-resist coatings where the translucent pigment, aluminum stearate, is incorporated in a light-sensitive polymeric composition.

A glass support was coated to an average thickness of about 1 mil with a composition (C) prepared as follows:

Solution A was prepared by dissolving 30 grams of cyclized natural rubber and 0.06 gram of 4,4′-diazidostilbene in xylene. Additive B was prepared by mixing 20.0 grams of aluminum stearate in 100 cc. of xylene and milling in a marble-type ball mill until a colloidal type dispersion was obtained. Two parts of solution A were mixed with two parts of additive B plus two parts of xylene, to give composition (C). Composition (C) was flow-coated on a glass support and left to dry in a near vertical position until sensibly dry and then it was prebaked to complete the drying operation. Prebaking to complete the removal of residual solvent was carried out by heating in an oven at 120° C. for 5 minutes.

A control plate was coated on a glass support to an equal thickness with composition (D). Composition (D) was prepared the same as composition (C) except that aluminum stearate was omitted from the coating composition.

Each plate was then exposed image-wise for 5 minutes to a 35 amp. carbon arc at a 3-foot distance. In each case, the exposed plates were solvent developed using xylene-stoddard solvent composition to remove the coating in the unexposed areas. The unexposed areas in each plate were then etched with 48% hydrofluoric acid. The control plate had ragged edges and pinholes after about 4 mils etch depth while the pigmented image performed satisfactorily to a depth of about 15 mils.

Following the etching operation the plates were examined. The examination showed that the plate coated with composition (C) showed a marked improvement in chemical resistance as compared to the control plate which was coated with the same composition except that aluminum stearate was omitted from the coating composition. Examination of the control showed ragged edges on the resist and in some areas there was a loss of the resist, and also pinholes were observed in the glass support in the areas where the resist had at first appeared to remain adhered to the support. The plate coated with the composition containing aluminum stearate additive showed none of these defects.

*Example 4*

The following example illustrates the use of synthetic mica as a translucent pigment.

Solution A was prepared as in Example 3. To solution A was added 100 cc. of xylene plus 20 grams of Synthamica (a synthetic mica sold by Mycalex Corporation of America). The pigmented dope was coated on a clean glass surface, dried, exposed and developed as in Example 3. The resulting resist-imaged support was etched in 48% hydrofluoric acid solution for 14 minutes which produced an etch depth of about 15 mils in the unprotected non-resist areas.

The control plate which paralleled the experiment was coated with a composition which contained no Synthamica. The control glass plate showed loosening of the resist from the support within 2 minutes in the etching bath.

*Example 5*

The following example illustrates the use of the translucent pigment, aluminum stearate, in a light-sensitive polyvinyl polymer composition where the composition was coated on a glass plate.

Solution D was prepared by dissolving 7.0 grams of poly(vinyl acetate-p-azido-benzoate) in 100 cc. of N-butylacetate. To solution D, 20 cc. of 20% aluminum stearate in xylene was added. The formulation was flow-coated on a clean glass support and allowed to dry in a near vertical position at room temperature. A control sample was prepared in the same manner and coated on a glass support except that the aluminum stearate was omitted from the coating composition. Each sample was then exposed image-wise for one minute to a 35 amp. carbon arc at a 3-foot distance. Thereafter each plate was developed in a vapor degreaser using trichloroethylene. From the development it was noted that the plate coated with the composition containing aluminum stearate showed an increase in photographic speed. Each sample was thereafter subjected to 48% hydrofluoric acid etching bath. In the etching bath the control image was lost within 20 to 30 seconds whereas the pigmented sample etched to a depth of 0.003 to 0.006 inch. The control sample lost during the etching was the result of the resist image floating free from the glass support within a 20 to 30 second interval after submersion in the hydrofluoric acid bath.

*Example 6*

The following example coats on an aluminum support.

Solution E was prepared by dissolving 7.0 grams of poly(vinylchalcone) in 100 cc. of cyclohexanone. One part of 20% aluminum stearate in xylene was added to two parts of the polymer to give composition (F). Composition (F) was then flow-coated onto pumiced aluminum and dried in a near vertical position at room temperature. A control aluminum support was coated with a composition comparable to composition (F) except that the aluminum stearate was omitted from the composition. The control aluminum support coated with the control composition was flow-coated and allowed to dry in a near vertical position at room temperature. Each sample was then exposed for 2 minutes to a 35 amp. carbon arc at a 3-foot distance. Each sample was thereafter developed in a vapor degreaser using trichloroethylene. The results of the development showed a relative speed increase in the plate coated with composition (F), that is the composition containing the aluminum stearate pigment. Each sample was thereafter etched in 42 degrees Baumé ferric chloride etching bath. The results in the etching bath were as follows: The control resist, that is, the aluminum plate coated with the composition from which aluminum stearate was omitted, was lost before an etch depth of 10 mils was obtained. The pigmented sample, that is, the aluminum support coated with the composition containing the aluminum stearate pigment according to our invention, was etched satisfactorily to a depth of 0.020 inch..

*Example 7*

The following example illustrates the use of aluminum stearate as the translucent pigment in a coating composition coated on a glazed ceramic tile support.

The coating composition was prepared as composition C of Example 3. The composition was then flow-coated onto a glazed ceramic tile support and placed in a near vertical position to dry. The plate was then prebaked as in Example 3, followed by exposure from behind a continuous tone negative for 4 minutes to a 35 amp. carbon arc at a 3-foot distance. The exposed plate was spray developed using a xylene-stoddard developer solution. A control plate paralleled the test plate except that the aluminum stearate additive was omitted from the coating composition. Each plate after development was given a wash-off with 70–80° F. tap water. During this wash-off much of the resist image on the control plate became loosened and was lost from the glazed tile support. The test plate coated with the composition containing the aluminum stearate was etched in a 48% hydrofluoric acid solution to a depth of about 3 mils.

*Example 8*

The following example illustrates the use of aluminum stearate as the translucent pigment in a coating composition coated on an unglazed ceramic tile support.

The coating composition was prepared as composition C of Example 3. A test plate and a control plate were prepared, exposed, developed, and washed as in Example 7. Each plate was then etched for 10 minutes in a 48% hydrofluoric acid solution. Upon examination of each plate after etching, it was noted that the control plate had a number of pinholes in the support in the areas which were protected by the resist. The test plate coated with the composition containing aluminum stearate showed considerably fewer of these.

In the description of our invention, when referring to the speed of the light-sensitive polymeric compositions prepared according to our invention, we mean a value representing the relative amount of light required to adequately insolubilize the compositions; this is, the layers of the polymeric compositions are tested for speed by exposure under a graduated photographic step tablet followed by washing off the unexposed portions with a suitable solvent. From the nature of the insoluble relief image remaining on the support, a speed value is calculated and assigned to the given polymer. This method of estimating speed of course simulates the method employed for utilizing the compositions for photomechanical purposes. In determining the speed increases obtained where the compositions of our invention are employed, we have utilized only the relative differences in speed and have not considered it necessary to attribute numerical values for such increases although such numerical values are realtively easy to employ as conventionally used in the art.

The advantages accruing as a result of our invention are the advantages realized from increased speed in the coating compositions and improved chemical and physical properties of the photoresist coatings. The improved chemical properties to which we refer comprise the increased chemical resistance to attack by and etching solutions; the improved physical properties comprise the increased adhesion to the support of photoresist coatings and the increased resistance to "swelling" of the photoresist in developer solvents.

The invention has been described in detail with particular reference to preferred embodiments thereof, but it will be understood that variation and modifications can be effected within the scope and spirit of the invention as described hereinabove and as defined in the appended claims.

We claim:

1. A photo-sensitive polymeric coating composition comprising:
   (1) a solution in an organic solvent of a light-sensitive film-forming polymer selected from the class consisting of a light-sensitized natural rubber latex, a light-sensitized cyclized rubber latex, and a light-sensitve ethylenically unsaturated vinyl polymer; and
   (2) a finely divided translucent pigment consisting of aluminum stearate being present in said composition in an amount, by weight, from about 0.3 to about 3.0 times the weight of said polymer.

2. A photo-sensitive coatng composition of claim 1 wherein said pigment consists of particles having a size no larger than 300 mesh.

3. A photo-sensitive coating composition of claim 1 in which the film-forming polymer is polyvinylcinnamate.

4. A photo-sensitive coating composition of claim 1 in which the film-forming polymer is polyvinylacetate p-azidobenzoate.

5. A photo-sensitive coating composition of claim 1 in which the film-forming polymer is polyvinylbenzophenone.

6. A photo-sensitive coating composition of claim 1 in which the film-forming polymer is a light-sensitized cyclized rubber.

7. A photographic element comprising a support having coated thereon a substantially dry photo-sensitive layer of a composition comprising:
   (1) a light-sensitive film-forming polymer selected from the class consisting of a light-sensitized natural rubber latex, a light-sensitized cyclized rubber latex, and a light-sensitive ethylenically unsaturated vinyl polymer; and
   (2) a finely divided translucent pigment consisting of aluminum stearate, said pigment being present in said composition in an amount, by weight, from about 0.3 to about 3.0 times the weight of said polymer.

8. A photographic element of claim 7 in which the said translucent pigment consists of particles having a size no larger than 300 mesh.

References Cited in the file of this patent

UNITED STATES PATENTS

| | | |
|---|---|---|
| 2,506,537 | Barnes et al. | May 2, 1950 |
| 2,831,767 | Dann et al. | Apr. 22, 1958 |
| 2,849,427 | Kennedy et al. | Aug. 26, 1958 |
| 2,852,379 | Hepher et al. | Sept. 10, 1958 |
| 2,852,381 | Minsk et al. | Sept. 16, 1958 |
| 2,892,716 | Martin | June 30, 1959 |
| 2,948,610 | Merrill et al. | Aug. 9, 1960 |
| 2,985,608 | Higgins et al. | May 23, 1961 |
| 3,011,984 | Muessig et al. | Dec. 5, 1961 |

FOREIGN PATENTS

| | | |
|---|---|---|
| 645,954 | Great Britain | Nov. 15, 1960 |